United States Patent
Takahashi et al.

(10) Patent No.: US 7,105,362 B2
(45) Date of Patent: Sep. 12, 2006

(54) METHOD OF FORMING DIELECTRIC FILM

(75) Inventors: Tsuyoshi Takahashi, Yamanashi (JP); Hiroshi Shinriki, Chiba (JP); Kazumi Kubo, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/527,683

(22) PCT Filed: Oct. 17, 2003

(86) PCT No.: PCT/JP03/13323

§ 371 (c)(1),
(2), (4) Date: Mar. 11, 2005

(87) PCT Pub. No.: WO2004/036640

PCT Pub. Date: Apr. 29, 2004

(65) Prior Publication Data

US 2006/0008969 A1    Jan. 12, 2006

(30) Foreign Application Priority Data

Oct. 21, 2002    (JP) .............................. 2002-305872

(51) Int. Cl.
*H01L 21/00* (2006.01)

(52) U.S. Cl. .......................... 438/3; 438/240; 438/761; 438/785; 267/E21.104; 267/E21.663

(58) Field of Classification Search .................. 438/3, 438/240, 761, 785, FOR. 395; 257/E21.104, 257/E21.663

See application file for complete search history.

(56) References Cited

U.S. PATENT DOCUMENTS

| | | | | |
|---|---|---|---|---|
| 6,475,854 | B1* | 11/2002 | Narwankar et al. | 438/238 |
| 6,664,116 | B1* | 12/2003 | Li et al. | 438/3 |
| 6,709,989 | B1* | 3/2004 | Ramdani et al. | 438/763 |
| 2004/0051134 | A1* | 3/2004 | Jang et al. | 257/316 |

FOREIGN PATENT DOCUMENTS

| | | |
|---|---|---|
| WO | WO 01/75956 A1 | 10/2001 |
| WO | WO 02/073679 A1 | 9/2002 |

* cited by examiner

*Primary Examiner*—Michelle Estrada
(74) *Attorney, Agent, or Firm*—Oblon, Spivak, McClelland, Maier & Neustadt, P.C.

(57) ABSTRACT

A method of forming a dielectric film by an organic metal CVD method, comprising the step of supplying an organic metal compound into a treating container having a substrate to be treated held therein to form the dielectric film on the substrate, wherein the dielectric film forming step comprises the first step of depositing, in the treating container, the dielectric film under a first condition so set as to allow the residence time of the organic metal compound to extend to a first value, and the second step of further depositing, after the first step and in the treating container, the dielectric film under a second condition so set as to allow the residence time of the organic metal compound to extend to a second value smaller than the first value.

20 Claims, 10 Drawing Sheets

METHOD OF FORMING DIELECTRIC FILM

FIELD OF THE INVENTION

The present invention relates to a film forming method; and, more particularly, to a method for forming a dielectric film wherein the dielectric film is formed on a substrate by using a gaseous source material.

BACKGROUND OF THE INVENTION

A CVD technique is a film forming method that is widely employed in the process of manufacturing a semiconductor device.

In today's ultrahigh speed semiconductor devices, a gate length can be as short as 0.1 μm or less thanks to the advancement in the miniaturization technique. Generally, the operational speed of a semiconductor device improves with the miniaturization. However, the film thickness of a gate insulating film needs to be reduced in accordance with a scaling rule in such an extremely miniaturized semiconductor device because miniaturization inevitably requires a reduction in the gate length.

Similarly, the film thickness of a capacitor insulating film needs to be decreased to a few nanometers or less in order to secure a sufficient capacitance in a semiconductor device having a super miniaturized capacitor, e.g., DRAM.

Therefore, efforts have been made to find a method for forming a gate insulating film or a capacitor insulating film with a high-k dielectric material, e.g., $HfO_2$ or $ZrO_2$, which allows a reduction in the electrical film thickness while maintaining its large physical thickness to thereby avoid an increase in the tunneling current.

Conventionally, such a high-k dielectric film has been made through a MOCVD technique using a metal organic (MO) material which can be deposited at a low temperature, e.g., at a temperature not exceeding 600° C. (see Japanese Patent Laid-open Application No. H9-129626).

However, the high-k dielectric film formed through the MOCVD method has an average roughness Ra of a few Å exceeding, e.g., 0.3 nm in general. If such a high-k dielectric film is employed as the aforementioned gate insulting film in an ultrahigh speed transistor or as the capacitor insulting film in a super miniaturized DRAM, several problems may arise: namely, a tunneling leakage current path may form locally at a thin part of the film; a concentration of an electric field may occur due to an irregularity on the film surface; and the tunneling leakage current may increase in a local leakage current path.

For instance, in case of a $HfO_2$ film formation in which tetra(tert-butoxy)hafnium is employed as a raw material, the average roughness Ra of the film is about 0.45 nm when the substrate is maintained at 550° C. and processed under a pressure of 0.3 Torr.

On the other hand, the average roughness Ra of a gate insulating film for MISFET is required to be smaller than or equal to 0.2 nm when the gate length thereof is 0.1 μm or less.

SUMMARY OF THE INVENTION

Accordingly, the present invention strives to provide a new and useful film forming method capable of solving all of the aforementioned problems.

Specifically, it is an objective of the present invention to provide a film forming method capable of reducing a surface roughness of a dielectric film when forming the dielectric film through a MOCVD method.

It is another objective of the present invention to provide a method for forming an insulating film, comprising the steps of: forming a base insulating film on a substrate; and forming a high-k dielectric film on the base insulating film, wherein the high-k dielectric film forming step includes: a first step of depositing, in the processing vessel, the high-k dielectric film under a first condition so as to allow a residence time of the metal organic compound to extend to a first value; and a second step for further depositing the high-k dielectric film under a second condition so as to allow the residence time of the metal organic compound to extend to a second value smaller than the first value.

When the high-k dielectric film such as a $HfO_2$ film or a $ZrO_2$ film is formed through the MOCVD in accordance with the present invention, the surface roughness of the film can be controlled. At the same time, deposition of decomposed and/or partially decomposed materials of the metal organic compound on a showerhead or the like can be suppressed.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

[First Preferred Embodiment]

Figure 1:
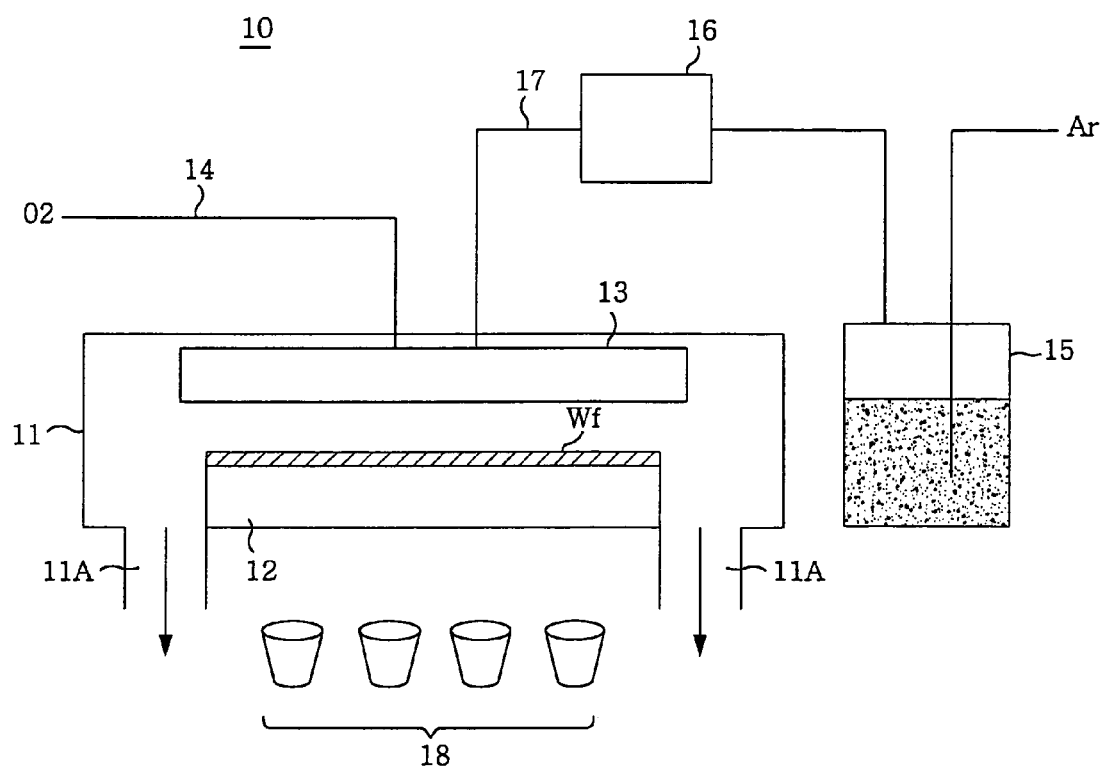
FIG. 1 shows the structure of a MOCVD apparatus used in accordance with a first preferred embodiment of the present invention.

FIG. 1 shows the structure of a MOCVD film forming apparatus 10 used in a first preferred embodiment of the present invention.

Referring to FIG. 1, a processing vessel 11 is provided in the MOCVD apparatus 10 at a gas exhaust port 11A to be exhausted by a pump (which is not shown in the drawing); and a substrate supporting table 12 for accommodating a substrate Wf is provided in the processing vessel 11.

In the MOCVD apparatus 10 of FIG. 1, a showerhead 13 made of aluminum or the like is provided to face the substrate Wf held on the supporting table 12 in the processing vessel 11. A line 14 for feeding oxygen gas into the processing vessel 11 is connected to the showerhead 13. The showerhead 13 is also provided with a source supply system, held in a bubbler 15, for feeding a liquid metal organic compound, e.g., tetra(tert-butoxy)hafnium or the like, into the processing vessel 11 via a controller 16 and a line 17.

Further, a heating device 18 composed of lamps is provided under the substrate supporting table 12 for heating the substrate Wf to a desired temperature.

Figure 2:
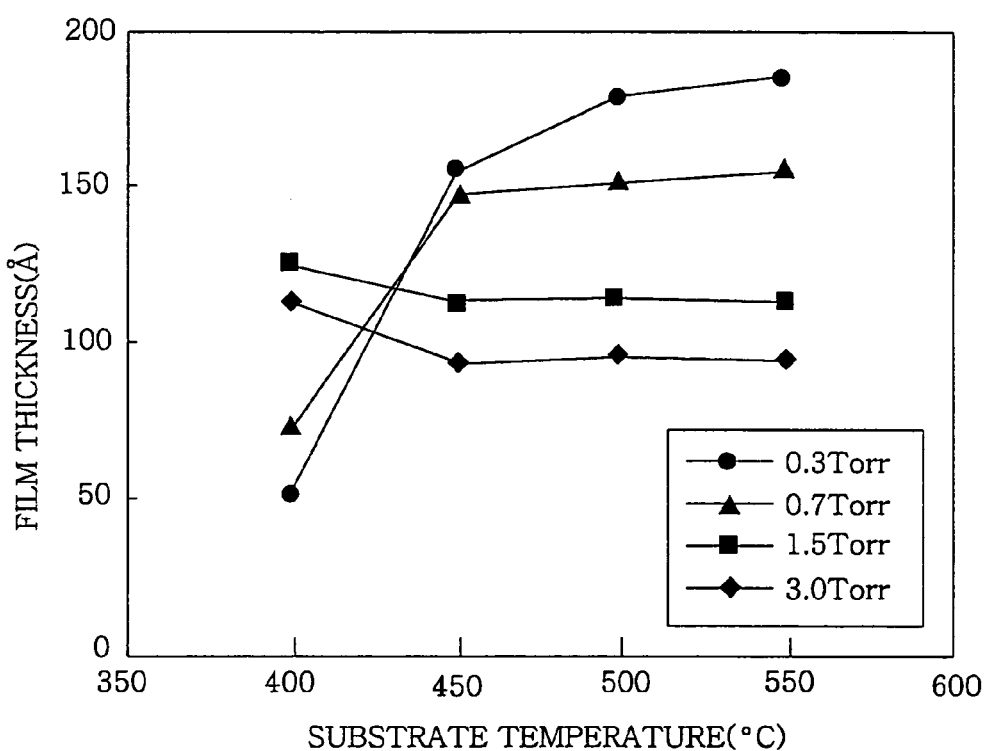
FIG. 2 illustrates a relationship between the film thickness and the substrate temperature of a $HfO_2$ film, the processing pressure being a parameter.

FIG. 2 provides the result of an experiment for forming a $HfO_2$ film, in accordance with the present invention, on a silicon substrate by using the MOCVD apparatus 10 of FIG. 1. In FIG. 2, the vertical axis represents the film thickness of the $HfO_2$ film, and the horizontal axis indicates the substrate temperature.

In this experiment, after a native oxide film was removed by a HF treatment, a silicon substrate on which an oxide film was formed through a rapid thermal oxidation (RTO) treatment was mounted as the substrate to be processed Wf on the substrate supporting table 12. Then, a $HfO_2$ film was deposited on the silicon substrate for 100 seconds by using tetra(tert-butoxy)hafnium as the metal organic compound while varying the substrate temperature and the processing pressure in the processing vessel 11. In this experiment, the temperature of the bubbler 15 was maintained at 40° C. and the tetra(tert-butoxy)hafnium was fed with an Ar bubbling gas flow at a flow rate of about 20 sccm. At the same time, oxygen having a flow rate of 1500 sccm was supplied. In this case, the flow rate of the tetra(tert-butoxy)hafnium was set at about 0.5 sccm.

Referring to FIG. 2, in case the substrate temperature is lower than 450° C., e.g., 400° C., the film forming speed and the resulting film thickness increase as the processing pressure is raised. However, if the substrate temperature exceeds 450° C., such tendency is reversed and, accordingly, the film forming speed increases as the processing pressure decreases. In FIG. 2, ● represents the deposition carried out under a processing pressure of 40 Pa (0.3 Torr); ▲ indicates the deposition carried out under the pressure of 93 Pa (0.7 Torr); ■ presents the deposition carried out under the pressure of 200 Pa (1.5 Torr); and ◆ provides the deposition carried out under the pressure of 400 Pa (3.0 Torr).

Figure 3:
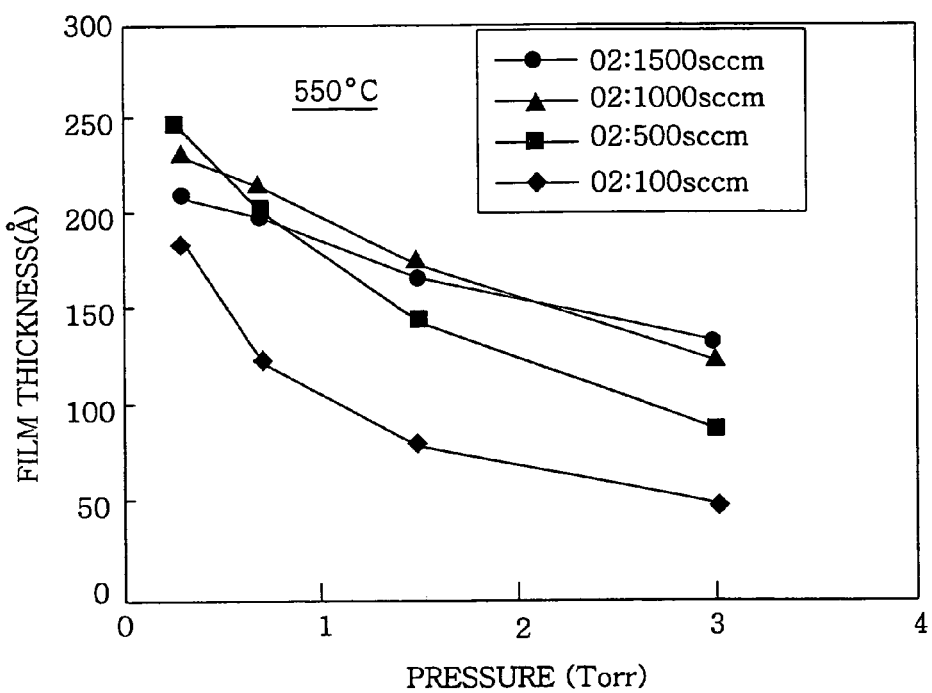
FIG. 3 describes a relationship between the film thickness and the processing pressure of a $HfO_2$ film, the oxygen flow rate being a parameter.

FIG. 3 illustrates a relationship between the processing pressure and the film thickness of the $HfO_2$ film obtained in this experiment at various oxygen flow rates. In FIG. 3, the vertical axis represents the film thickness of the obtained $HfO_2$ film, and the horizontal axis indicates the processing pressure. In FIG. 3, ● presents the deposition performed at the oxygen flow rate of 1500 sccm; ▲ indicates the deposition performed at the oxygen flow rate of 1000 sccm; ■ represents the deposition performed at the oxygen flow rate of 500 sccm; and ◆ provides the deposition performed at the oxygen flow rate of 100 sccm. FIG. 3 shows the result of the $HfO_2$ film forming process, conducted at a substrate temperature of 550° C. and a treating time of 100 seconds.

As shown in FIG. 3, the obtained film thickness of the $HfO_2$ film decreases as the processing pressure increases, irrespective of the change in the oxygen flow rates.

The results shown in FIGS. 2 and 3 suggest that the deposition speed of a $HfO_2$ film tends to decrease with an increase in the processing pressure even though the amount of the metal organic compound supplied into the processing vessel is uniformly maintained. This indicates that the supplied tetra(tert-butoxy)hafnium is adhered to an inner wall of the processing vessel 11 or the showerhead 13 instead of being deposited as the $HfO_2$ film on the substrate Wf when the processing pressure is high.

Such adhesion of the metal organic compound onto the inner surface of the processing vessel 11 or the showerhead 13 is attributable to the collision of the metal organic compound with the inner wall surface of the processing vessel 11 or the showerhead 13 while the metal organic compound is staying in the processing vessel. In other words, the deposition of the metal organic compound on the inner wall of the processing vessel or the showerhead is considered to be dependent on the residence time of the metal organic compound in the processing vessel 11. On the other hand, the deposition of the $HfO_2$ film on the substrate Wf occurs when the metal organic compound introduced from the showerhead 13 flows along the surface of the substrate Wf through a pyrolysis reaction therebetween and, basically, the deposition thereof is considered to be not affected by the residence time of the metal organic compound in the processing vessel 11.

Figure 4:
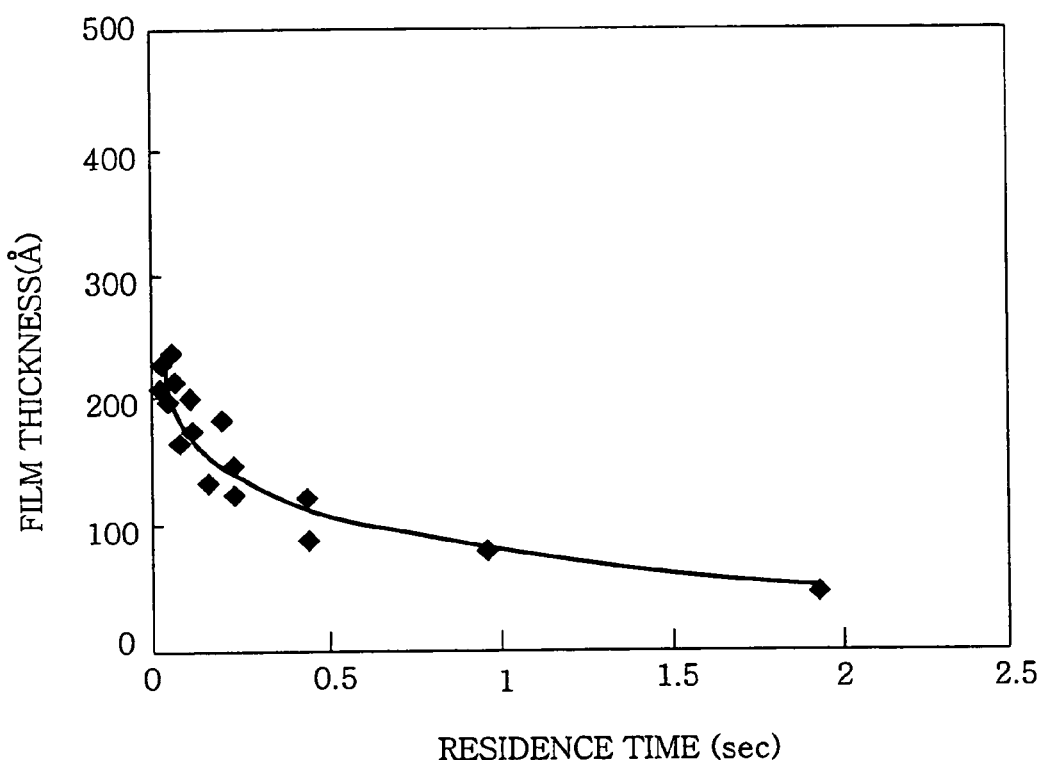
FIG. 4 depicts a relationship between the film thickness of a $HfO_2$ film and the residence time of a metal organic compound.

FIG. 4 expresses the result shown in FIG. 3 in terms of a relationship between the film thickness of the $HfO_2$ film and the residence time. The residence time in FIG. 4 can be expressed by the following equation:

(residence time of a film forming gas)=(reactor pressure×reactor capacity)/(flow rate of a film forming gas), and is indicative of an average length of time required in exhausting the metal organic compound introduced into the processing vessel 11. The residence time decreases as the flow rate of the metal organic compound increases and also increases with an increase in the processing pressure. The residence time is not equivalent to a processing time and, thus, should not be confused therewith.

Referring to FIG. 4, it is shown that the film thickness of the $HfO_2$ film deposited on the substrate Wf decreases with an increase in the residence time. This result suggests that the metal organic compound is adhered to other portions as well in addition to the surface of the substrate Wf.

Figure 5A:
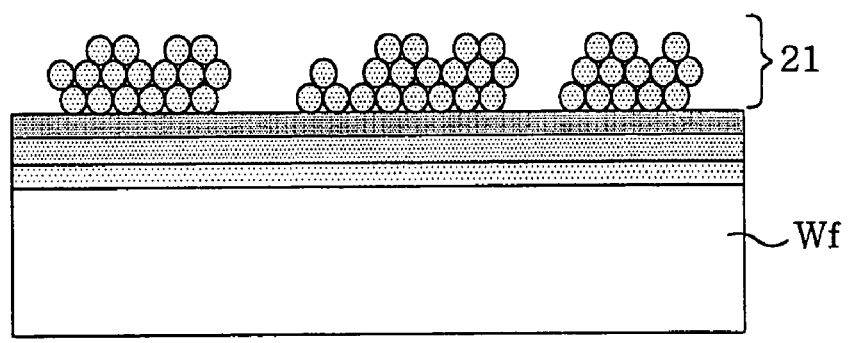
FIGS. 5A and 5B outline a film forming process of a $HfO_2$ film, conducted at a relatively high processing pressure.
Figure 5B:
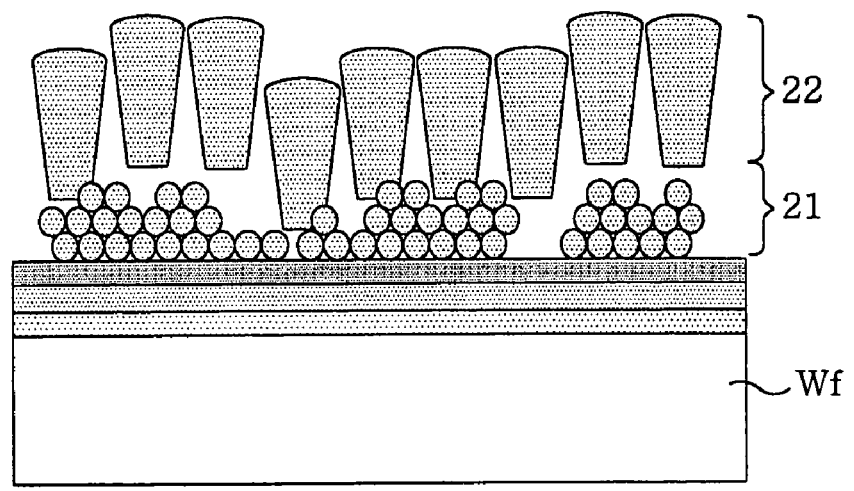

FIGS. 5A and 5B schematically depict a deposition process of the $HfO_2$ film on the surface of the substrate Wf in case the residence time of the metal organic compound is set to be long in the processing vessel.

Referring to FIG. 5A, due to the long residence time of the metal organic compound, crystalline nuclei 21 are formed on the surface of the substrate Wf at a relatively high areal density during an initial deposition process. As a result, a $HfO_2$ film 22 composed of crystals having relatively small particle diameters is formed through a constant growth of the crystalline nuclei 21. As mentioned above, however, if the residence time of the metal organic compound is set to be long, molecules of the metal organic compound collide with the showerhead 13 or the inner wall of the processing vessel 11 repetitiously, thereby causing a large amount of the metal organic compound to adhere to the showerhead 13 or the inner wall of the processing vessel 11 either as $HfO_2$ molecules or in an incomplete or decomposed form thereof. As a result, the film forming speed of the $HfO_2$ film on the surface of the substrate Wf may decrease.

Figure 6A:
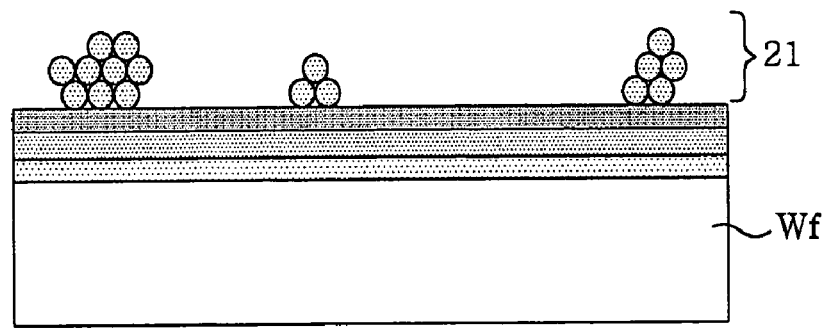
FIGS. 6A and 6B sketch a film forming process of a HfO2 film, conducted at a relatively low processing pressure.
Figure 6B:
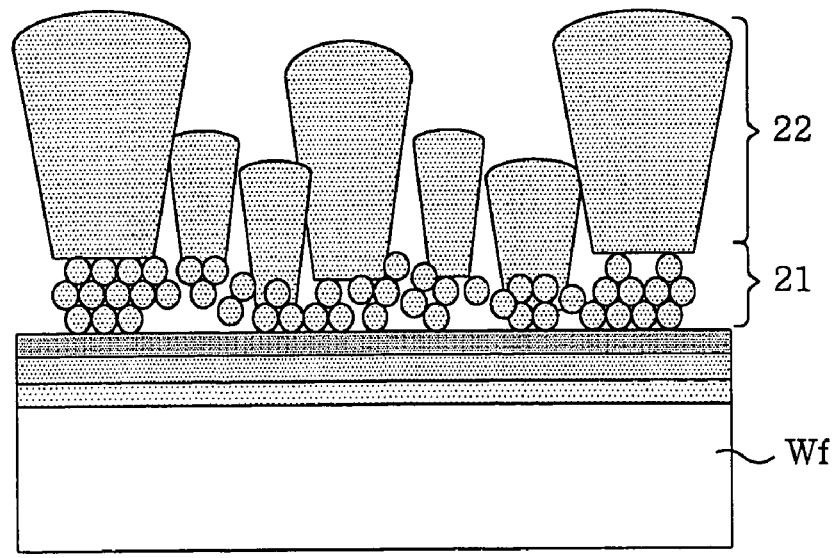

FIGS. 6A and 6B schematically describe a deposition process of a HfO$_2$ film on the substrate Wf when the residence time of the metal organic compound is set to be short.

Referring to FIG. 6A, in case the residence time of the metal organic compound in the processing vessel 11 is short, the HfO$_2$ nuclei 21 formed on the surface of the substrate Wf are distributed sparsely compared with the case discussed above. Accordingly, each particle of the HfO$_2$ crystal tends to grow relatively free of encumbrances from other growing particles in the HfO$_2$ film, as described in FIG. 6B. As a result, each HfO$_2$ crystal particle grows large having a bigger particle diameter, thereby increasing the surface roughness of the resulting HfO$_2$ film 22. In addition, other nuclei may be newly added to the surface of the substrate Wf even in the midst of the growth of the HfO$_2$ film 22 in the process as described in FIG. 6B, and the HfO$_2$ crystal grains may also grow from such newly added nuclei. As the HfO$_2$ crystal grains growing from the incipient nuclei may suppress the development of the HfO$_2$ crystal grains growing from the subsequently added nuclei, there may exist a mixed state of large and small crystal grains inside the film in the process of FIG. 6B.

In the processes shown in FIGS. 6A and 6B, due to the short residence time of the metal organic compound in the processing vessel 11, the deposition of the HfO$_2$ film or the adhesion of partially decomposed molecules of the metal organic compound to the showerhead 13 or the inner wall of the processing vessel 11 may be suppressed. However, there may still lie problems such as: the resultant HfO$_2$ film may be in a heterogeneous state; and may be possessed with a large surface roughness.

Figure 7:
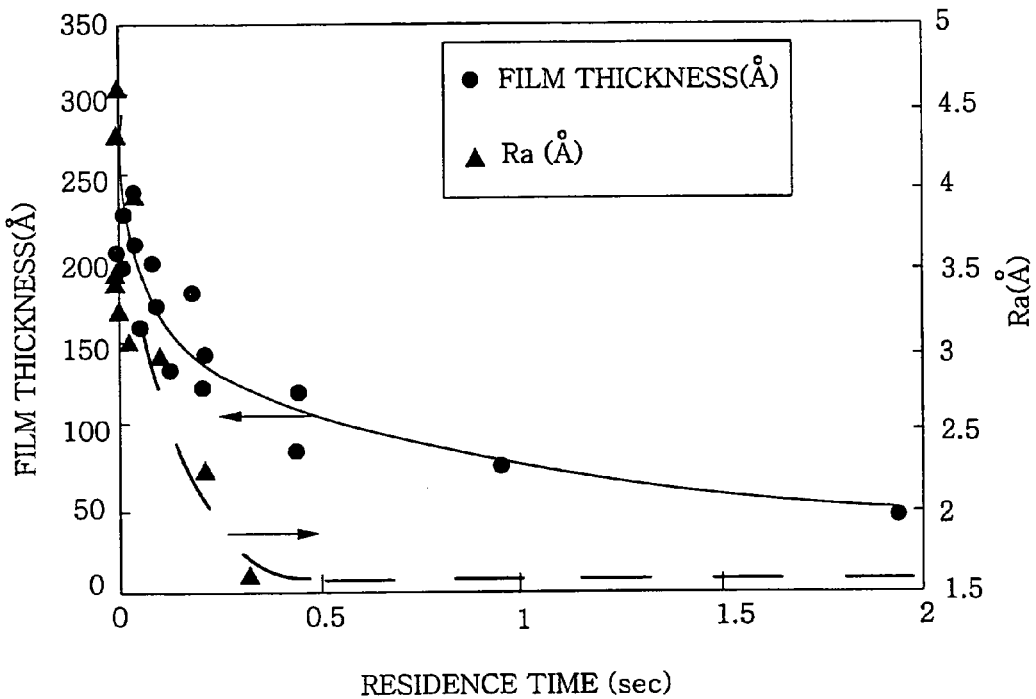
FIG. 7 represents a relationship between the film thickness of a $HfO_2$ film and the residence time of a metal organic compound in a processing vessel during the film forming process, the relationship being expressed in an overlap over the diagram of FIG. 4.

FIG. 7 shows a relationship between the residence time of the metal organic compound in the processing vessel 11 and the surface roughness of the HfO$_2$ film, the relationship being expressed in an overlap over the diagram of FIG. 4. In FIG. 7, the vertical axis on the right side of the graph represents an average surface roughness Ra indicated in the unit of Å (unit of 0.1 nm), which is shown in the graph as a plot of ▲.

Referring to FIG. 7, the film thickness and the surface roughness Ra of the HfO$_2$ film are shown to be inversely proportional to the residence time. Specifically, if the residence time is less than 0.1 second, the surface roughness Ra exceeds 3 Å, i.e., 0.3 nm.

The problem of the surface roughness of the HfO$_2$ film is not critical in case the film thickness is greater than or equal to a few nanometers. However, if the HfO$_2$ film is employed as a gate insulating film in an ultrahigh speed semiconductor device in which the gate length is less than 0.1 μm, or as a capacitor insulting film in a DRAM using less than 0.1 μm-design rule, a local leakage current path can be easily formed due to the aforementioned concentration of the electric field and/or the local change in the film thickness, thereby failing to stop the formation of the tunneling leakage current after all the labor of replacing the film with high-k dielectric material.

Conversely, if FIG. 7 is referred to again, it can be easily noticed that the surface roughness Ra of the HfO$_2$ film decreases and can be reduced to e.g., about 0.16 nm if the residence time becomes long, e.g., in excess of 0.4 second. This clearly indicates that an increase in the residence time may entail an increase in the collision frequency of the metal organic compound molecules with the surface of the substrate Wf and, as a result, may allow the formation of the crystalline nuclei 21 of HfO$_2$ at a high areal density.

Table 1, given below, summarizes the results discussed above.

TABLE 1

|  | Surface roughness | No deposition on showerhead |
|---|---|---|
| Short residence time | x | ○ |
| Long residence time | ○ | x |

Figure 8:
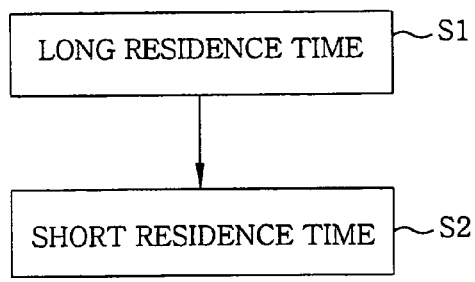
FIG. 8 offers a flowchart depicting a process for forming a high-k dielectric film in accordance with the present invention.

FIG. 8 presents a process for forming, using a MOCVD method, a HfO$_2$ film in accordance with the first preferred embodiment of the present invention, which solves the aforementioned problems.

Figure 9A:
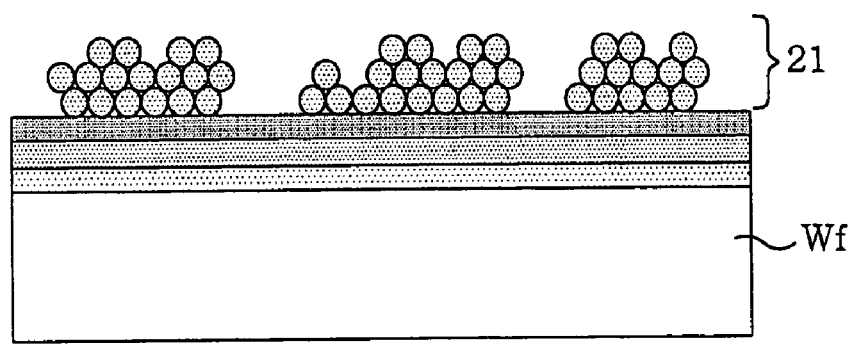
FIGS. 9A and 9B schematically explain the process of FIG. 8.

Referring to FIG. 8, in this preferred embodiment, the film forming process is performed for 5–10 seconds by using the MOCVD system 10 of FIG. 1, wherein the residence time of tetra(tert-butoxy)hafnium used as the metal organic compound in the processing vessel 11 is set at a first value, e.g., 3.2 seconds, and, then, the crystalline nuclei 21 of HfO$_2$ are formed on the substrate Wf at a high areal density, as described in FIG. 9A. In other words, the process of FIG. 9A corresponds to the aforementioned process described in FIG. 5A.

Specifically, in the process of FIG. 9A, the substrate Wf is held at 550° C. while the processing pressure is set at a relatively high level of 200–400 Pa (1.5–3.0 Torr). By supplying Ar gas having a flow rate of 20 sccm in the bubbler 15, tetra(tert-butoxy)hafnium is fed into the processing vessel 11 via the showerhead 13. At the same time, oxygen gas having a flow rate of 1500 sccm is supplied from a line 14. As a result, in step 1 of FIG. 8, the crystalline nuclei of HfO$_2$ are formed on the surface of the substrate Wf at a high areal density, as described in FIG. 9A.

As previously explained, the residence time of the metal organic compound in the processing vessel 11 is long in the process of step 1 and, thus, decomposed and/or partially decomposed materials of the metal organic compound may be easily deposited on the showerhead 13 or the inner wall of the processing vessel 11. Therefore, the process of step 1 may be completed in a relatively short period of time, e.g., within 5–10 seconds, to prevent a substantial deposition of the decomposed material and/or partially decomposed materials.

Next, in the process of step 2 in this preferred embodiment, the residence time is set at a second value which is smaller than the first value, e.g., 0.03 second, and the deposition of the HfO$_2$ film is performed until a desired film thickness is obtained, e.g., for 30–100 seconds, under the same conditions as in step 1 except for the residence time. To be more specific, the HfO$_2$ film is formed under the conditions identical to those in step 1 except that the processing pressure of the processing vessel 11 is reduced to about 40 Pa (0.3 Torr) or below.

Figure 9B:
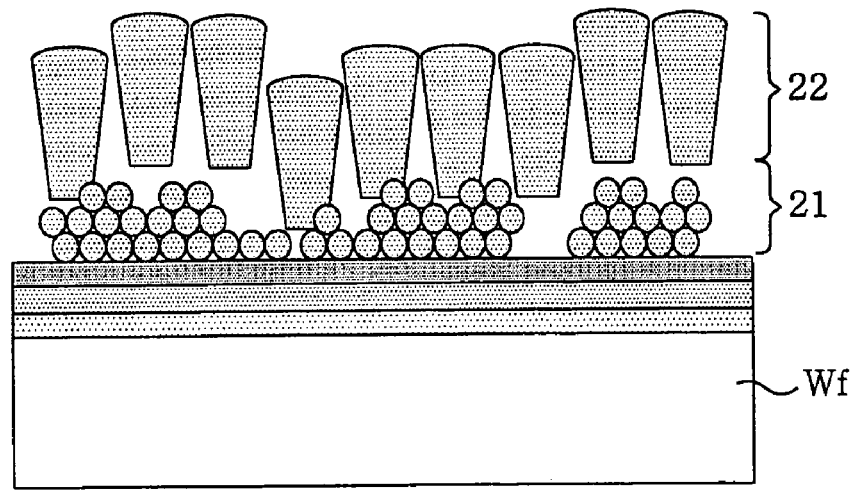

Even though it is true that the HfO$_2$ crystals grow from the HfO$_2$ crystalline nuclei formed on the substrate Wf as illustrated in FIG. 9B, unlike the aforementioned case of FIG. 6B, the HfO$_2$ crystal grains grow uniformly and in relatively small and even sizes to thereby entail a uniform HfO$_2$ film having a reduced surface roughness owing to the high areal density of the HfO$_2$ crystalline nuclei 21 formed on the surface of the substrate Wf in the process of step 1. In the process of FIG. 9B, the residence time is considerably shortened and, accordingly, the adhesion of the decomposed material or the partially decomposed material of the metal organic compound onto the showerhead 13 or the inner wall of the processing vessel 10 is suppressed.

Figure 10:
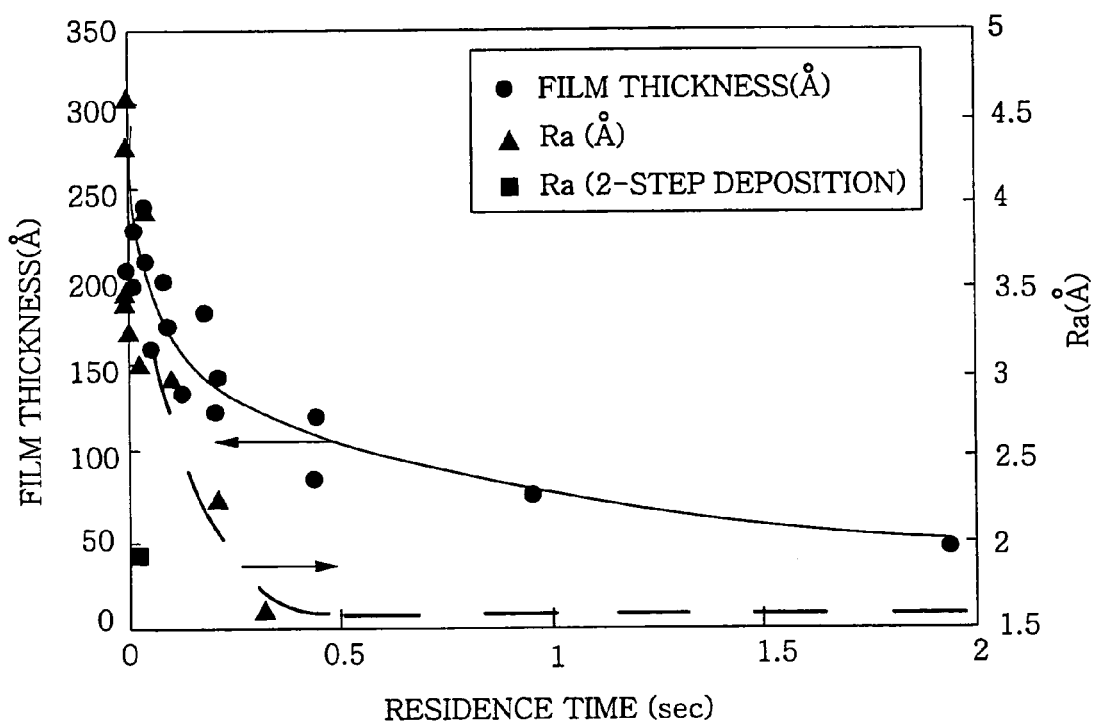
FIG. 10 presents the effects of the present invention expressed in an overlap over the diagram of FIG. 7.

In FIG. 10, the point indicated by an arrow represents the surface roughness Ra of the $HfO_2$ film formed by the two step process of FIG. 8.

Referring to FIG. 10, the surface roughness Ra of the $HfO_2$ film is about 0.19 nm, satisfying the condition required for the surface roughness Ra (Ra≦0.2 nm) as a gate insulating film in an ultrahigh speed MISFET. In Table 10, it is shown that the residence time is required to be about 0.25 second in order for the surface roughness Ra to be 0.2 nm. Therefore, the residence time is set to exceed 0.25 second in step 1 of FIG. 8 and to be 0.25 second or less in step 2, so that the $HfO_2$ film having a desired small surface roughness can be obtained while minimizing the deposition of the decomposed and/or partially decomposed materials of the metal organic compound on the inner wall of the processing vessel or the showerhead.

Table 2, provided below, is illustrative of the beneficial effects of the two step process of the present invention.

TABLE 2

|  | Surface roughness | No deposition on showerhead |
| --- | --- | --- |
| Short residence time | x | o |
| Long residence time | o | x |
| Two step film forming process | o | o |

As can be seen from table 2, when a high-k dielectric film such as a $HfO_2$ film or a $ZrO_2$ film is formed by the MOCVD method in accordance with the present invention, the surface roughness control of the film can be effectively made while suppressing the deposition of decomposed and/or partially decomposed materials of the metal organic compound on a showerhead or the like.

Although the present invention has been described with respect to the formation of the $HfO_2$ film in the above, formation of a $ZrO_2$ film can also be carried out. In such case, tetra(tert-butoxy)zirconium can be used instead of tetra(tert-butoxy)hafnium.

Further, the present invention is useful in forming a $HfO_2$ film by using tetrakis(diethylamido)hafnium (TDEAH: $Hf[N(C_2H_5)_2]_4$) or tetrakis(dimethylamido)hafnium (TDMAH: $Hf[N(CH_3)_2]_4$).

Furthermore, the present invention is not limited to the formation of a $HfO_2$ film or a $ZrO_2$ film but is also useful in forming a high-k dielectric film such as a hafnium silicate ($HfSiO_4$) film, a zirconium silicate ($ZrSiO_4$) film, a PZT ($Pb(Zr,Ti)O_3$) film, a BST ($BaSrTiO_3$) film or the like; or a ferroelectric film. For example, in order to form $HfSiO_4$ film, it is possible to use a combination of tetra(tert-butoxy) hafnium and tetraethoxysilane (TEOS), or a combination of TDEAH/TDMAH and tetrakis(diethylamido)silane or tetrakis(dimethlyamido)silane.

In addition, in this preferred embodiment, the control of the residence time of the metal organic compound in the processing vessel 11 can be executed by changing the amount of the metal organic compound fed into the processing vessel 11, i.e., the flow rate, and is not limited to the manipulation of the processing pressure. For example, the residence time can be controlled by setting the flow rate of the metal organic compound in step 1 in FIG. 8 to be small while setting that in step 2 to be large, which can be garnered from the equation given above. The residence time can also be controlled by setting the flow rate of a carrier gas or oxygen gas at a small value in the process of step 1 and then increasing the flow rate thereof in the process of step 2.

[Second Preferred Embodiment]

FIGS. 11A to 11E provide a manufacturing process of a semiconductor device in accordance with a second preferred embodiment of the present invention.

Figure 11A:
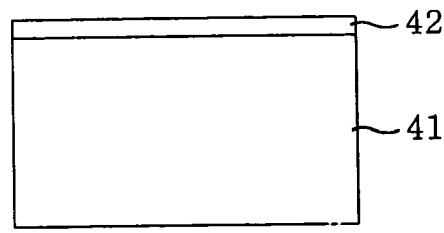
FIGS. 11A to 11D provide a manufacturing process of a semiconductor device in accordance with a first preferred embodiment of the present invention.
Figure 11B:
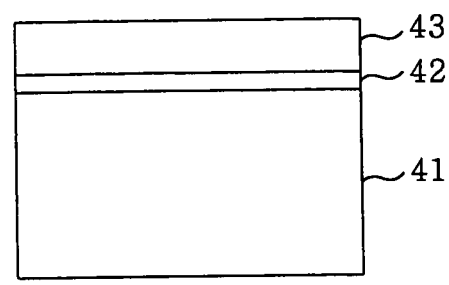

Referring to FIG. 11A, a base insulating film 42 composed of a $SiO_2$ film or a SiON film having a film thickness of 1 nm or less is formed on a silicon substrate 41 by performing a radical oxidization treatment using, e.g., a UV excited oxygen radical, or by performing a plasma radical nitration after the radical oxidization treatment. Then, in the process of FIG. 11B, a metal oxide film 13 such as $HfO_2$ or $ZrO_2$ is formed in the two step process as previously described in FIG. 8 on the base oxide film 42 through a metal organic chemical vapor deposition (MOCVD) method with a metal organic material such as tetra(tert-butoxy)hafnium or tetra(tert-butoxy)zirconium at a substrate temperature of 450–600° C.

Figure 11C:
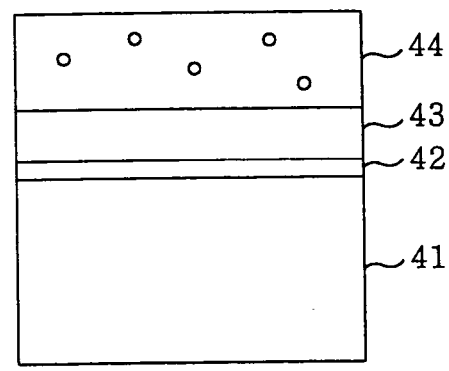
Figure 11D:
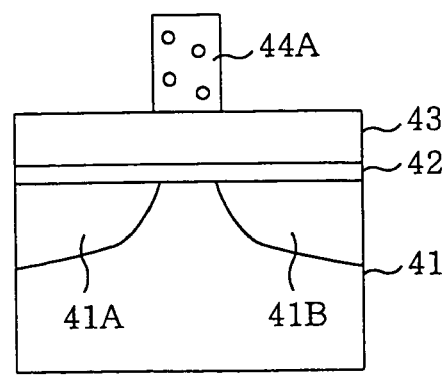

Thereafter, in the process of FIG. 11C, a polysilicon film 44 is deposited on the metal oxide film 43. Although not shown in the drawing, a silicide film is formed on the surface thereof and, then, in a process of FIG. 11D, a gate electrode 44A is formed by patterning the silicide film. Further, by executing an ion injection with a mask of the gate electrode 44A, diffusion areas 41A and 41B may be formed at both sides of the gate electrode 44A in the silicon substrate 41.

In accordance with this embodiment, the surface roughness of the gate insulating film composed of the metal oxide film 43 can be suppressed within 0.2 nm, and it is possible to effectively suppress a tunneling leakage current passing through the gate insulating film.

In the same manner, a capacitor insulating film of DRAM can be formed with $HfO_2$ film or $ZrO_2$ film in accordance with the present invention.

While the invention has been shown and described with respect to the preferred embodiments, it will be understood by those skilled in the art that various changes and modifications may be made without departing from the spirit and scope of the invention as defined in the following claims.

INDUSTRIAL APPLICABILITY

In accordance with the present invention, when a high-k dielectric film such as a $HfO_2$ film or a $ZrO_2$ film is formed by a MOCVD method, it is possible to suppress a surface roughness of the film while suppressing a deposition of decomposed and/or partially decomposed materials of a metal organic compound.

What is claimed is:

1. A method for forming an insulating film, the method comprising the steps of:
    forming a base insulating film on a substrate; and
    forming a high-k dielectric film on the base insulating film,
    wherein the high-k dielectric film forming step includes:
    the first step of depositing, in a processing vessel, the high-k dielectric film under a first condition so as to allow a residence time of a metal organic compound to extend to a first value; and
    the second step for further depositing the high-k dielectric film under a second condition so as to allow the residence time of the metal organic compound to extend to a second value smaller than the first value.

2. The method for forming the insulating film of claim 1, wherein, in the first step, a processing pressure in the processing vessel is set at a first processing pressure, and, in the second step, the processing pressure in the processing vessel is set at a second processing pressure which is lower than the first processing pressure.

3. The method for forming the insulating film of claim 1, wherein, in the first step, a flow rate of a carrier gas or oxygen gas supplied into the processing vessel is set at a first flow rate, and, in the second step, the flow rate of the carrier gas or the oxygen gas is set at a second flow rate which is greater than the first flow rate.

4. The method for forming the insulating film of claim 1, wherein the high-k dielectric film is a crystalline film, and in the first step, crystalline nuclei of the high-k dielectric film are formed on the substrate.

5. The method for forming the insulating film of claim 1, wherein the metal organic compound is an organic compound containing Hf or Zr, and the high-k dielectric film is a $HfO_2$ film or a $ZrO_2$ film.

6. The method for forming the insulating film of claim 1, wherein the metal organic compound is tetra(tert-butoxy)hafnium, and the residence time is set to exceed 0.25 second in the first step and to be less than 0.25 second in the second step.

7. The method for forming the insulating film of claim 6, wherein, in the first step, a processing pressure in the processing vessel is set to exceed 133 Pa, and in the second step, the processing pressure in the processing vessel is set at 133 Pa or below.

8. The method for forming the insulating film of claim 6, wherein, in the first step, a processing pressure in the processing vessel is set at 200–400 Pa, and in the second step, the processing pressure in the processing vessel is set at about 40 Pa or below.

9. The method for forming the insulating film of claim 6, wherein the first and the second steps of the high-k dielectric film forming step are performed at a temperature of 450° C. or higher.

10. The method for forming the insulating film of claim 6, wherein the first and the second steps of the high-k dielectric film forming step are performed at a temperature of about 550° C.

11. The method for forming the insulating film of claim 1, wherein the first step is for forming nuclei of the high-k dielectric film on a surface of the substrate.

12. The method of forming the insulating film of claim 11, wherein the second step is for uniformly growing crystal grains of the high-k dielectric film from the nuclei.

13. A method for forming a high-k dielectric film comprising the steps of:
    forming a base insulating film on a substrate in a processing vessel; and
    forming the high-k dielectric film on the base insulating film in the processing vessel,
    wherein the high-k dielectric film forming step includes:
    the first step for supplying a metal organic compound gas and an oxidation gas into the processing vessel to form nuclei of the high-k dielectric film on the base insulating film under a first condition to allow a residence time of the metal organic compound gas in the processing vessel to extend to a first value; and
    the second step for further supplying the metal organic compound and the oxidation gas into the processing vessel to uniformly grow grains of the high-k dielectric film from the nuclei under a second condition so as to allow the residence time of the metal organic compound gas in the processing vessel to extend to a second value which is smaller than the first value.

14. The method for forming the high-k dielectric film of claim 13, wherein a surface roughness of the high-k dielectric film is to be controlled by the first and the second values.

15. The method for forming the high-k dielectric film of claim 13, wherein the metal organic compound is an organic compound containing Hf or Zr, and the high-k dielectric film is a $HfO_2$ film or a $ZrO_2$ film.

16. The method for forming the high-k dielectric film of claim 13, wherein the metal organic compound is tetra(tert-butoxy)hafnium, and the residence time is set to exceed 0.25 second in the first step and to be less than 0.25 second in the second step.

17. The method for forming the high-k dielectric film of claim 16, wherein, in the first step, a processing pressure in the processing vessel is set to exceed 133 Pa, and in the second step, the processing pressure in the processing vessel is set at 133 Pa or below.

18. The method for forming the high-k dielectric film of claim 16, wherein, in the first step, a processing pressure in the processing vessel is set at 200–400 Pa, and in the second step, the processing pressure in the processing vessel is set at about 40 Pa or below.

19. The method for forming the high-k dielectric film of claim 16, wherein the first and the second steps of the high-k dielectric film forming step are performed at a temperature of 450° C. or higher.

20. The method for forming the high-k dielectric film of claim 1, wherein a surface roughness of the high-k dielectric film is controlled by the first and the second values.

\* \* \* \* \*